(12) United States Patent
Mazraehno et al.

(10) Patent No.: US 11,764,330 B2
(45) Date of Patent: Sep. 19, 2023

(54) OPTOELECTRONIC SEMICONDUCTOR COMPONENT HAVING A SEMICONDUCTOR CONTACT LAYER AND METHOD FOR PRODUCING THE OPTOELECTRONIC SEMICONDUCTOR COMPONENT

(71) Applicant: OSRAM OLED GmbH, Regensburg (DE)

(72) Inventors: Mohammad Tollabi Mazraehno, Jena (DE); Mariel Grace Jama, Regensburg (DE); Hans-Jürgen Lugauer, Sinzing (DE); Alexander Pfeuffer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 305 days.

(21) Appl. No.: 17/269,212

(22) PCT Filed: Aug. 9, 2019

(86) PCT No.: PCT/EP2019/071474
§ 371 (c)(1),
(2) Date: Feb. 17, 2021

(87) PCT Pub. No.: WO2020/038743
PCT Pub. Date: Feb. 27, 2020

(65) Prior Publication Data
US 2021/0288221 A1 Sep. 16, 2021

(30) Foreign Application Priority Data
Aug. 22, 2018 (DE) .......................... 102018120490.6

(51) Int. Cl.
*H01L 33/00* (2010.01)
*H01L 33/38* (2010.01)
(Continued)

(52) U.S. Cl.
CPC ........ *H01L 33/382* (2013.01); *H01L 33/0075* (2013.01); *H01L 33/32* (2013.01); *H01L 33/40* (2013.01)

(58) Field of Classification Search
CPC ....... H01L 33/32; H01L 33/382; H01L 33/40; H01L 33/0075
See application file for complete search history.

(56) References Cited

U.S. PATENT DOCUMENTS 5,670,798 A  9/1997 Schetzina
6,046,464 A  4/2000 Schetzina
(Continued)

FOREIGN PATENT DOCUMENTS

DE  69833514 T2  10/2006
JP  2014045192 A  3/2014
(Continued)

*Primary Examiner* — Savitri Mulpuri
(74) *Attorney, Agent, or Firm* — Slater Matsil, LLP (57) ABSTRACT

In an embodiment, an optoelectronic semiconductor component includes a first semiconductor layer of a first conductivity type, a second semiconductor layer of a second conductivity type, wherein a respective semiconductor material of the first and second semiconductor layers are each a compound semiconductor material including a first, a second and a third composition element, and a second contact region configured to electrically contact the second semiconductor layer, wherein the first semiconductor layer is patterned and arranged over the second semiconductor layer, wherein the second contact region is arranged between patterned regions of the first semiconductor layer, wherein the second contact region comprises a second metallic contact layer and a semiconductor contact layer between the second metallic contact layer and the second semiconductor layer, wherein a semiconductor material of the semiconductor contact layer includes the first, second and third composition elements, and wherein a concentration of the first (Continued)

and second composition elements varies from a position on a side of the second semiconductor layer to a position on a side of the second metallic contact layer.

9 Claims, 4 Drawing Sheets

(51) Int. Cl.
*H01L 33/32* (2010.01)
*H01L 33/40* (2010.01)

(56) References Cited

U.S. PATENT DOCUMENTS

| | | |
|---|---|---|
| 6,100,586 A | 8/2000 | Chen et al. |
| 9,257,599 B2 | 2/2016 | Kim et al. |
| 9,478,718 B2 | 10/2016 | Kim |
| 2013/0334552 A1 | 12/2013 | Yang et al. |
| 2015/0295137 A1* | 10/2015 | Pfeuffer .................. H01L 33/40 |
| | | 438/29 |

FOREIGN PATENT DOCUMENTS

| | | |
|---|---|---|
| JP | 2015046598 A | 3/2015 |
| JP | 2016526801 A | 9/2016 |

\* cited by examiner

OPTOELECTRONIC SEMICONDUCTOR COMPONENT HAVING A SEMICONDUCTOR CONTACT LAYER AND METHOD FOR PRODUCING THE OPTOELECTRONIC SEMICONDUCTOR COMPONENT

This patent application is a national phase filing under section 371 of PCT/EP2019/071474, filed Aug. 9, 2019, which claims the priority of German patent application 102018120490.6, filed Aug. 22, 2018, each of which is incorporated herein by reference in its entirety.

BACKGROUND

A light emitting diode (LED) is a light emitting device based on semiconductor materials. For example, an LED includes a pn junction. When electrons and holes recombine with one another in the region of the pn junction, due, for example, to a corresponding voltage being applied, electromagnetic radiation is generated.

In general, new concepts are sought which allow for the efficiency of the components, i.e., the ratio of the output optical power and the supplied electrical power, to be increased.

SUMMARY OF THE INVENTION

Embodiments provide an improved optoelectronic semiconductor component.

According to embodiments, an optoelectronic semiconductor component comprises a first semiconductor layer of a first conductivity type; a second semiconductor layer of a second conductivity type; a respective semiconductor material of the first and second semiconductor layers each being a compound semiconductor material containing a first, a second and a third composition element; and a second contact region for electrically contacting the second semiconductor layer. The second contact region comprises a second metallic contact layer and a semiconductor contact layer between the second metallic contact layer and the second semiconductor layer. A semiconductor material of the semiconductor contact layer includes the first, second and third composition elements, wherein the concentration of the first and second composition elements varies from a position on a side of the second semiconductor layer to a position on the side of the second metallic contact layer.

For example, the second semiconductor layer is arranged over the first semiconductor layer and is patterned. The second contact region may be arranged between patterned regions of the first semiconductor layer. The first semiconductor layer may be patterned in such a way that it is removed from parts of the second semiconductor layer.

The optoelectronic semiconductor component may further comprise a semiconductor connecting layer between the semiconductor contact layer and the second metallic contact layer, the semiconductor connecting layer including two of the group consisting of the first, second and third composition elements. For example, the semiconductor connecting layer may include solely two of the group consisting of the first, second and third composition elements. According to embodiments, a concentration of a composition element of the semiconductor contact layer in a region from the second semiconductor layer to the second metallic contact layer may decrease.

For example, a band gap of a material of the semiconductor connecting layer may be smaller than a band gap of the second semiconductor layer.

According to configurations, the first semiconductor layer may include the same composition elements as the second semiconductor layer. The composition ratio of the composition elements in the first and second semiconductor layers may be the same or different.

According to embodiments, the first semiconductor layer may include a plurality of sublayers composed of the same composition elements, the doping level or composition ratio of the composition elements differing in at least two sublayers.

The respective composition elements of the second semiconductor layer may each be selected from the group consisting of In, Al, Ga, B and N. For example, the respective composition elements of the second semiconductor layer may each include Al, Ga and N. Furthermore, the second semiconductor layer may additionally include In. According to further embodiments, the respective composition elements of the second semiconductor layer may each include In, Ga and N. Alternatively, the respective composition elements of the second semiconductor layer may each include Al, B and N, or may each include Ga, B and N.

A method for producing an optoelectronic semiconductor component comprises patterning a first semiconductor layer of a first conductivity type, which is arranged over a second semiconductor layer of a second conductivity type, such that the first semiconductor layer is removed from parts of the second semiconductor layer and patterned regions of the first semiconductor layer are formed, a respective semiconductor material of the first and second semiconductor layer each being a compound semiconductor material which includes a first, a second and a third composition element. The method further comprises forming a semiconductor contact layer and a second metallic contact layer between the patterned regions of the first semiconductor layer, wherein a second contact region is formed for electrically contacting the second semiconductor layer. The semiconductor contact layer is formed between the second metallic contact layer and the second semiconductor layer. A semiconductor material of the semiconductor contact layer includes the first, second and third composition elements, wherein a concentration of the first and second composition elements varies from a position on a side of the second semiconductor layer to a position on the side of the second metallic contact layer.

The semiconductor contact layer may be formed by selective epitaxial growth over exposed regions of the second semiconductor layer. The method may further comprise forming a semiconductor connecting layer between the semiconductor contact layer and the second metallic contact layer, wherein the semiconductor connecting layer includes two of the group consisting of the first, second and third composition elements.

For example, a concentration of a composition element of the semiconductor contact layer may decrease in a region from the second semiconductor layer to the second metallic contact layer. The method may furthermore comprise forming a layer stack comprising the first and the second semiconductor layer before patterning the first semiconductor layer. The first and the second semiconductor layer may in particular be grown epitaxially.

In accordance with further embodiments, an optoelectronic semiconductor component comprises a first semiconductor layer of a first conductivity type, a second semiconductor layer of a second conductivity type, and a second contact region for electrically contacting the second semiconductor layer. The second contact region comprises a second metallic contact layer, and a semiconductor contact layer between the second metallic contact layer and the second semiconductor layer. A band gap of a semiconductor material as the semiconductor contact layer decreases from a position on a side of the second semiconductor layer to a position on the side of the second metallic contact layer.

For example, the first semiconductor layer is arranged over the second semiconductor layer and patterned. The second contact region may be arranged between patterned regions of the first semiconductor layer. The first semiconductor layer may be patterned in such a way that it is removed from parts of the second semiconductor layer.

The optoelectronic semiconductor component may furthermore comprise a semiconductor connecting layer between the semiconductor contact layer and the second metallic contact layer. In this case, a band gap of a material of the semiconductor connecting layer is smaller than the band gap of the second semiconductor layer. For example, the band gap of the semiconductor material of the semiconductor contact layer may be smaller than the band gap of the semiconductor material of the second semiconductor layer and larger than the band gap of the semiconductor material of the semiconductor connecting layer.

According to embodiments, an optoelectronic device comprises the optoelectronic semiconductor component described above. The optoelectronic device may be a UV illumination device or a UV analyzer, for example.

BRIEF DESCRIPTION OF THE DRAWINGS

The accompanying drawings serve to provide an understanding of exemplary embodiments of the invention. The drawings illustrate exemplary embodiments and, together with the description, serve to explain them. Further exemplary embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION OF ILLUSTRATIVE EMBODIMENTS

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is only used by way of explanation and is in no way intended to be limiting.

The phrase "the first semiconductor layer is arranged over the second semiconductor layer" is intended to mean in particular that the first and the second semiconductor layers are part of a semiconductor layer stack. Depending on the positioning of the optoelectronic semiconductor component, this phrase may also mean that the second semiconductor layer is arranged over the first semiconductor layer.

The description of the exemplary embodiments is not limiting, since there are also other exemplary embodiments, and structural or logical changes may be made without departing from the scope as defined by the claims. In particular, elements of the exemplary embodiments described below may be combined with elements from others of the exemplary embodiments described, unless the context indicates otherwise.

The semiconductor materials mentioned in the context of the present description may be based on a direct semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as AlGaAs, SiC, ZnSe, GaAs, ZnO, $Ga_2O_3$, diamond, hexagonal BN and combinations of the materials mentioned. The stoichiometric ratio of the ternary compounds may vary. Other examples of semiconductor materials may include silicon, silicon germanium, and germanium.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may for example be in a plane perpendicular to a direction of growth when layers are grown.

The term "vertical" as used in this description is intended to describe an orientation which is essentially perpendicular to the first surface of the semiconductor substrate or semiconductor body. The vertical direction may correspond, for example, to a direction of growth when layers are grown.

To the extent used herein, the terms "have", "contain", "comprise", and the like are open-ended terms that indicate the presence of said elements or features, but do not exclude the presence of further elements or features. The indefinite articles and the definite articles include both the plural and the singular, unless the context clearly indicates otherwise.

The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

Figure 1A:
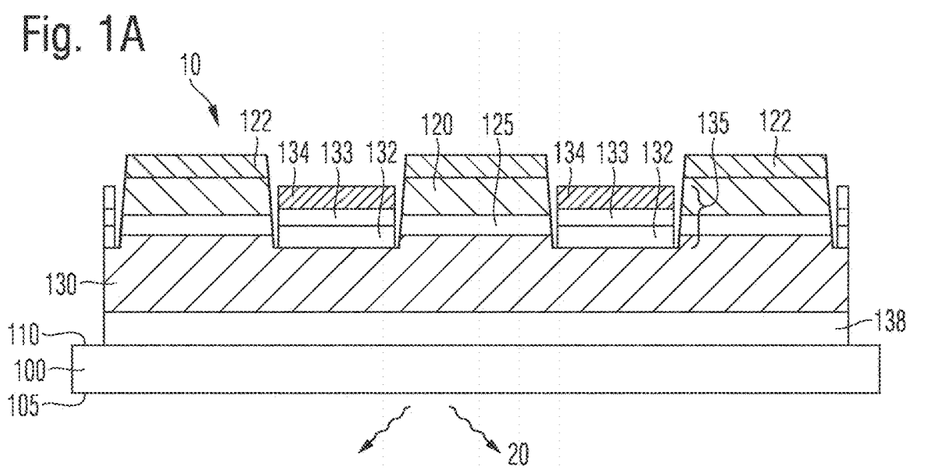
FIG. 1A shows a schematic cross-sectional view of an optoelectronic semiconductor component according to embodiments.

FIG. 1A shows a vertical cross-sectional view of an optoelectronic semiconductor component 10 according to embodiments.

The optoelectronic semiconductor component 10 comprises a first semiconductor layer 120 of a first conductivity type, for example p-type, and a second semiconductor layer 130 of a second conductivity type, for example n-type. A respective semiconductor material of the first and second semiconductor layers is each a compound semiconductor material which includes a first, a second and a third composition element. The optoelectronic semiconductor component 10 furthermore comprises a second contact region for electrically contacting the second semiconductor layer 130. The second contact region 135 comprises a second metallic contact layer 134 and a semiconductor contact layer 132 between the metallic contact layer 134 and the second semiconductor layer 130. A semiconductor material of the semiconductor contact layer 132 includes the first, second and third composition elements, with the concentration of the first and second composition elements varying from a position on one side of the second semiconductor layer 130 to a position on the side of the metallic contact layer 134.

For example, a semiconductor layer stack including the first and second semiconductor layers 120, 130 is arranged on a transparent substrate 100, for example a sapphire substrate or a native AlN substrate. The substrate may also be composed from other materials, for example non-transparent materials such as GaN, silicon or silicon carbide. The second semiconductor layer 130 may be arranged between a second main surface 11$o$ of the substrate 100 and the first semiconductor layer 120. According to further embodiments, however, the optoelectronic semiconductor component may also be embodied without a substrate 100.

According to embodiments, a buffer layer 138 may furthermore be arranged between substrate 100 and the second semiconductor layer 130. The buffer layer 138 may contain an AlN layer and optionally further layers, for example further AlGaN layers. The buffer layer 138 may reduce dislocations and defects in the second semiconductor layer. The buffer layer may, for example, compensate for a lattice mismatch between the substrate 100 and the second semiconductor layer 130. Overall, the crystal quality of the second semiconductor layer 130 may be improved by the presence of the buffer layer 138. For example, the use of a buffer layer 138 may be beneficial in cases where a non-native substrate 100 such as a sapphire substrate is used.

Electromagnetic radiation 20 emitted by the optoelectronic semiconductor component may, for example, be emitted via a first main surface 105 of the substrate. According to further embodiments, electromagnetic radiation 20 emitted by the optoelectronic semiconductor component may also be emitted via the side of the component facing away from the substrate 100.

The first main surface 105 is opposite to the second main surface 11$o$. An active region 125 may be arranged between the first and second semiconductor layers 120, 130. The active region 125 may, for example, have a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these structures.

The optoelectronic semiconductor component may further comprise a semiconductor connecting layer 133 between the semiconductor contact layer 132 and the metallic contact layer 134. The semiconductor connecting layer 133 may include two of the group consisting of the first, second, and third composition elements. If, for example, the second semiconductor layer 130 comprises the composition $A_xB_{1-x}C$, the semiconductor connecting layer 133 may comprise the composition AC. If the second semiconductor layer 130 comprises the composition $A_xB_yD_{1-x-y}C$, the semiconductor connecting layer 133 may comprise the composition $A_xB_{1-x}C$. For example, C may in each case represent nitrogen (N). Furthermore, the stoichiometric proportion y of B in the semiconductor contact layer 132 may decrease within the layer. For example, the stoichiometric proportion y of B on the side facing away from the second semiconductor layer 130 may decrease to almost zero. The proportion of the composition element may, for example, drop within the semiconductor contact layer in a strictly monotonic manner. Furthermore, it may decrease gradually or in a stepwise manner. Consequently, the band gap within the semiconductor contact layer 132 decreases towards the second metallic contact layer 134. For example, the band gap of the material of the semiconductor contact layer may decrease from a value which is approximately similar to the band gap of the material of the second semiconductor layer 130 to a value which corresponds to the band gap of the semiconductor connecting layer 133.

According to embodiments, the semiconductor connecting layer 133 may include solely two of the group consisting of the first, second, and third composition elements, i.e., the proportion of the composition element B may be zero. For example, the first semiconductor layer 120 may include the same composition elements as the second semiconductor layer 130. The composition ratio of the composition elements in the first and second semiconductor layers may be the same or may differ from each another. As a result, the semiconductor connecting layer 133 has a smaller band gap than the second semiconductor layer 130 and than the semiconductor contact layer 132.

According to embodiments, the second semiconductor layer 130 may include Al, Ga and N, for example. In this case, the semiconductor connecting layer 133 may, for example, include GaN. Furthermore, the Al content in the semiconductor contact layer 132 decreases. For example, it may decline within the semiconductor contact layer 132 from a value that is similar to or equal to the value in the second semiconductor layer 130 to a lower value. According to further embodiments, the second semiconductor layer 130 and, if appropriate, the first semiconductor layer 120 may include (Al,In)GaN. More precisely, the material of the second semiconductor layer 130 may be a quaternary semiconductor material, with the proportion of two components in the semiconductor contact layer 132 decreasing, so that the band gap within the semiconductor contact layer 132 is reduced. According to further embodiments, the material of the second semiconductor layer 130 may be or include AlGaInBN, with the proportion of second components in the semiconductor contact layer 132 decreasing, so that the band gap within the semiconductor contact layer 132 is reduced.

According to further embodiments, the second semiconductor layer may also include InGaN. In this case, for example, the Ga content in the semiconductor contact layer 132 may decrease, so that the band gap in the semiconductor contact layer 132 is reduced. Furthermore, the semiconductor connecting layer 133 may include InN. According to further embodiments, the material of the second semiconductor layer may also include AlBN or GaBN or (Al,Ga)BN.

The semiconductor contact layer 132 and the semiconductor connecting layer 133 may each be n-doped according to embodiments. For example, the semiconductor contact layer 132 and the semiconductor connecting layer 133 may each be doped with silicon. For example, the silicon content in the semiconductor contact layer 132 may be adjusted in accordance with the varying content of the first and second composition elements. For example, the Si doping level may be reduced when the Al content is increased and vice versa. However, the variation in the Si doping level may be very small, depending on the growth parameters.

A layer thickness of the semiconductor contact layer 132 may, for example, be greater than 10 nm, for example 20 to 50 nm, for example 20 to 30 nm. If the layer thickness is too small, the contact resistance is increased. If the layer thickness becomes too great, the forward voltage may not be reduced any further. A layer thickness of the semiconductor connecting layer 133 may be less than 100 nm, for example.

A first metallic contact layer 122 may be arranged over and electrically connected to the first semiconductor layer 120. The first and the second metallic contact layers may, for example, include a stack of different layers, for example Ti/Al/Ti/Au. However, they may also be composed of individual layers. Furthermore, the first and second metallic contact layers may contain a transparent conductive material. This is beneficial in cases in which light is to be emitted via the surface of the optoelectronic component on which the first and second metallic contact layers are arranged.

The second contact region comprises a second metallic contact layer and a semiconductor contact layer between the metallic contact layer and the second semiconductor layer. Due to the special nature of the semiconductor contact layer, a band gap in the material of the semiconductor contact layer decreases from a position on the second semiconductor layer towards the second metallic contact layer. As a result, the effective Schottky barrier of the second contact region may be greatly reduced. In the presence of the semiconductor connecting layer, which has a smaller band gap than the second semiconductor layer, for example, between the semiconductor contact layer and the metallic contact layer, this effective Schottky barrier of the second contact region may be further reduced. As a result, the corresponding contact resistance is reduced. Due to the reduced contact resistance, the forward voltage of the LED may be reduced. As a result, the efficiency of the LED is increased. Furthermore, due to the reduced forward voltage, it is possible to operate at high currents and to achieve an improved service life.

Figure 1B:
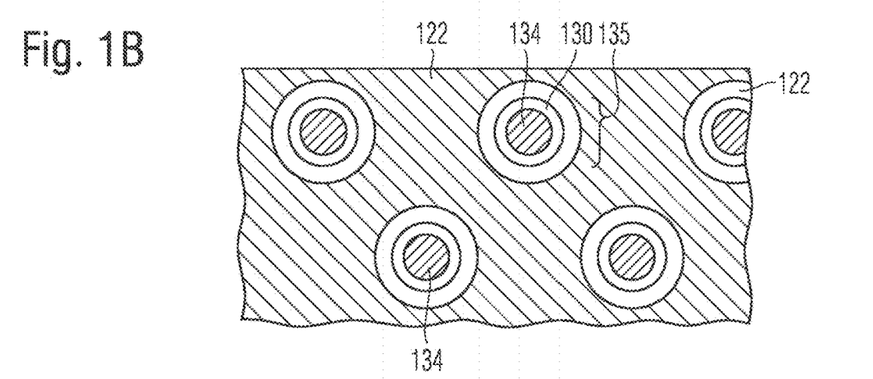
FIGS. 1B and 1C show schematic top views of the optoelectronic semiconductor component according to embodiments.

FIG. 1B shows a plan view of an optoelectronic semiconductor component according to embodiments. As shown, the second contact regions 135 may, for example, be island-shaped, for example circular between patterned regions of the first semiconductor layer 120. The first metallic contact layer 122 may be formed between the second contact regions 135. The first metallic contact layer 122 need not necessarily cover the entire surface of the first semiconductor layer 120. It may also cover the surface of the first semiconductor layer 120 only partially or in portions.

Figure 1C:
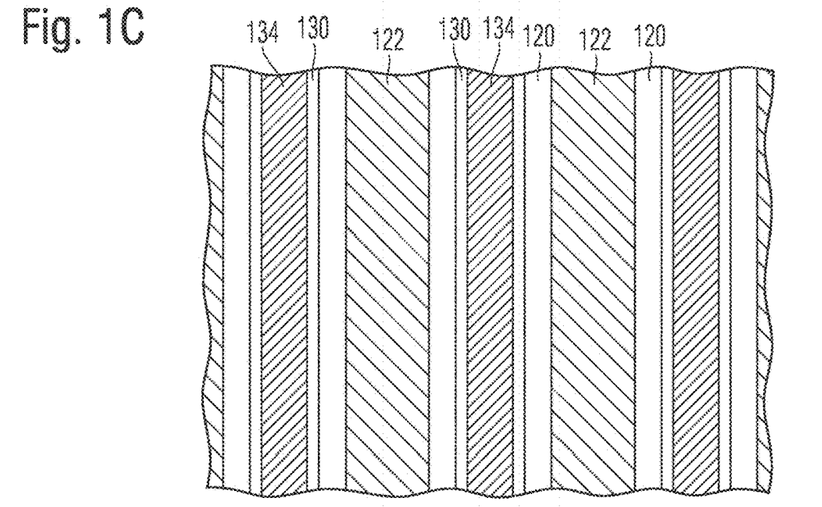

According to further embodiments, it is also possible to design the second contact regions 135 in the shape of strips, as shown in FIG. 1C. In this case, strips of the second contact region 135 may alternate with strips of the first metallic contact layer 122 and may form a finger structure, for example. It goes without saying that these layouts are given solely by way of example and that any layout of the first metallic contact layer 122 and the second contact regions 135 may be used.

The described LED may, for example, be used to generate electromagnetic radiation in the lower UV range, i.e. at wavelengths from 206 to 360 nm. For example, the range of emitted wavelengths may be in a range from 217 to 280 nm. The described structure of the second contact region may be used, for example, in cases in which a semiconductor material with a large band gap is used and in which the activation energy of the dopant of the second semiconductor layer is high. In this case, the semiconductor contact layer may reduce the band gap as the concentration of a composition element decreases. As a result, the Schottky barrier may be reduced.

According to embodiments, the first semiconductor layer 120 may be p-doped and the second semiconductor layer 130 may be n-doped. The second semiconductor layer 130 may, for example, include a nitride semiconductor material such as GaN or AlN and may be doped with silicon. In this case, the activation energy of the dopant is high. According to further embodiments, the first semiconductor layer 120 may be n-doped and the second semiconductor layer 130 may be p-doped. For example, in this case the second semiconductor layer 130 may include a nitride semiconductor material such as GaN or AlN and may be doped with magnesium.

In the following, a method for producing the optoelectronic semiconductor component according to embodiments is described with reference to FIGS. 2A to 2E.

Figure 2A:
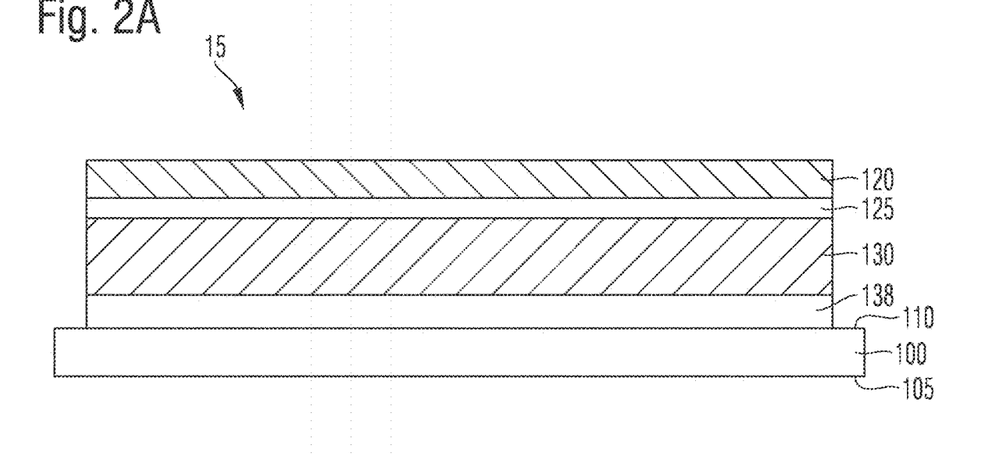
FIGS. 2A to 2E show cross-sectional views of a workpiece in the course of performing a method according to embodiments.

A buffer layer 138 as described above may first be grown over the second main surface 110 of an insulating substrate 100, for example a sapphire substrate. Then a second semiconductor layer 130 of a second conductivity type, for example n-type, may first be grown. For example, this may be an AlGaN layer doped with silicon. An active region 125 is formed over these layers. The first semiconductor layer 120 of the first conductivity type, for example p-type, may then be formed. For example, this layer may be an AlGaN layer, too. According to further embodiments, however, it may also be a layer stack made of GaN with any admixture of Al. For example, different p-doped AlGaN layers of different compositions and doping levels may first be formed. Finally, for example, a p-doped GaN layer may be grown. In addition, an active region 125 may be formed as described above. FIG. 2A shows a cross-sectional view of a resulting workpiece 15.

Figure 2B:
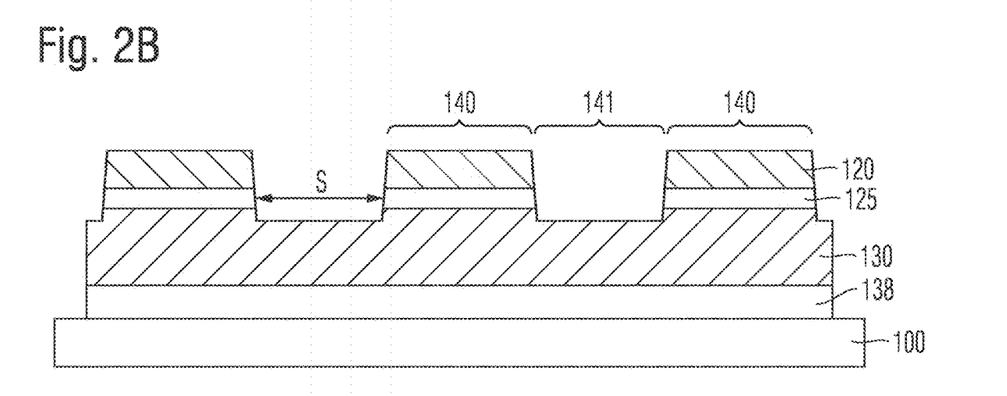

Then, as illustrated in FIG. 2B, trenches 141 are formed, for example by etching, which are separated by the adjacent mesas 140. The trenches 141 may, for example, have a circular or oval shape, as illustrated in FIG. 1B. According to further embodiments, however, the trenches 141 may extend in strips in a direction perpendicular to the cross-sectional plane. The dimensions of the second contact region may be set depending on the dimensions of the trenches 141. For example, the contact resistance may be further reduced by enlarging the second contact region. A lateral dimension s of the trenches 141 may, for example, be 5 μm to 30 μm, for example approximately 10 μm.

Figure 2C:
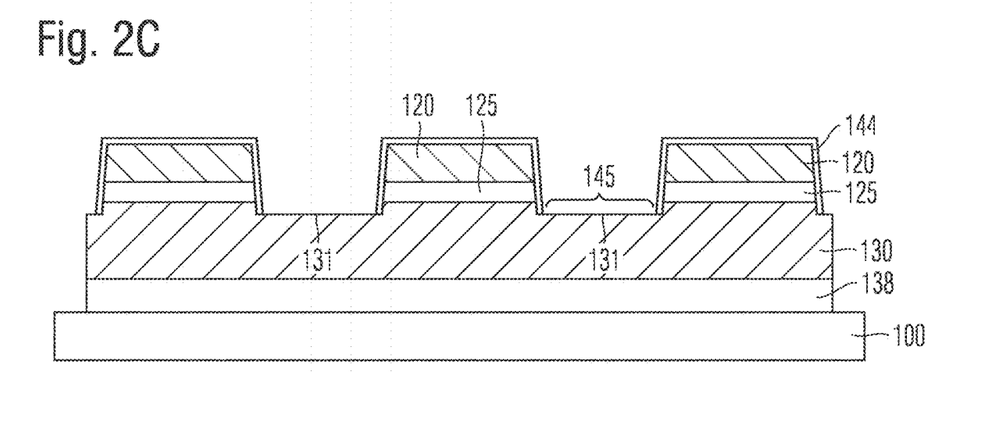

Then, as illustrated in FIG. 2C, a mask layer 144 is formed over the resulting structure. For example, the mask layer may include silicon dioxide. The mask layer 144 may, for example, be deposited conformally. The layer thickness of the mask layer may be dimensioned, for example, in such a way that a desired distance is set between the second contact region and the first semiconductor layer 120. If the layer thickness of the mask layer 144 becomes too great, the contact resistance may be reduced due to the reduced contact area. The mask layer 144 is then opened on the bottom side of the trenches 141, for example by etching, thereby forming openings 145, so that part of a surface 131 of the second semiconductor layer 130 is uncovered and exposed.

Figure 2D:
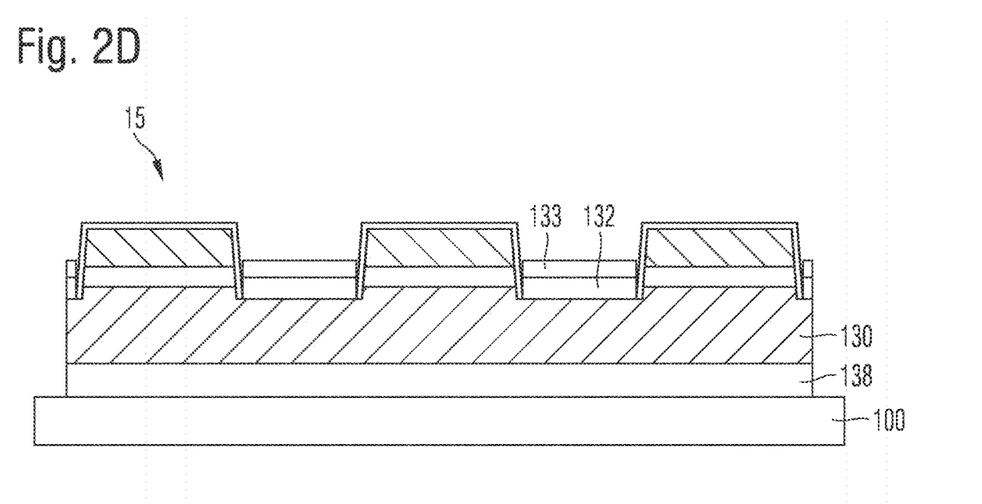

A further step for performing an epitaxial method is then carried out. First, the semiconductor contact layer 132 is formed with a varying composition ratio. This may be carried out by adjusting the concentration of the supplied gases. For example, the Al content in the semiconductor contact layer 132 may decrease. The method of forming the semiconductor connecting layer is a selective method, i.e., the layer is only grown on the exposed regions 131 of the second semiconductor layer 130. A semiconductor connecting layer 133 may then be formed over the semiconductor contact layer. FIG. 2D shows an example of a resulting workpiece 15.

Figure 2E:
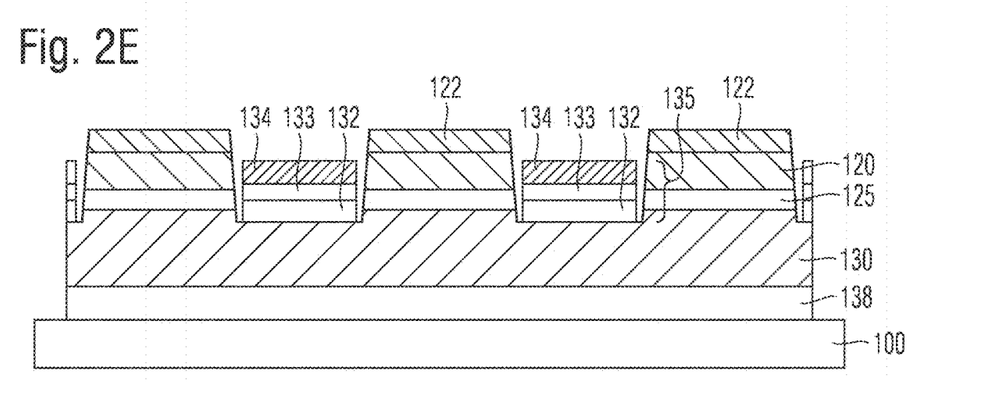

After removing the mask layer, as shown in FIG. 2E, a metal layer is formed. The formation of the metal layer may, for example, comprise forming a plurality of layers from suitable materials, for example from Ti, Al, Ni, Au and mixtures of these materials. This metal layer forms the second metallic contact layer 134 over the semiconductor contact layer and the semiconductor connecting layer, whereby a second contact region 135 results. Furthermore, the metal layer forms the first metallic contact layer 122 over the first semiconductor layer.

As a result, the semiconductor component shown in FIG. 1A is produced.

The method may be modified in a suitable manner if, for example, the first semiconductor layer is of the n-type and the second semiconductor layer is of the p-type. Furthermore, according to embodiments, the substrate 100 may be removed after the described method steps have been carried out.

Figure 3:
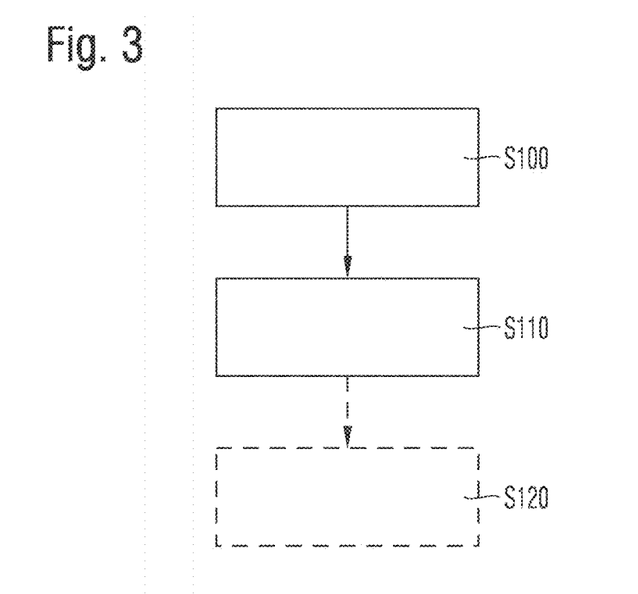
FIG. 3 outlines a method according to embodiments.

FIG. 3 outlines a method according to embodiments.

A method for producing an optoelectronic semiconductor component comprises forming (S100) a layer stack which comprises a first semiconductor layer of a first conductivity type and a second semiconductor layer of a second conductivity type, a respective semiconductor material of the first and second semiconductor layers each being a compound semiconductor material including a first, a second and a third composition element, and forming (S110) a semiconductor contact layer and a second metallic contact layer, wherein a second contact region for electrically contacting the second semiconductor layer is formed. The semiconductor contact layer is formed between the second metallic contact layer and the second semiconductor layer. A semiconductor material of the semiconductor contact layer includes the first, second and third composition elements, wherein a concentration of the first and second composition elements varies from a position on a side of the second semiconductor layer to a position on the side of the second metallic contact layer. The method may further include forming (S120) a semiconductor connecting layer between the semiconductor contact layer and the second metallic contact layer, the semiconductor connecting layer including two from the group consisting of the first, second and third composition elements.

Figure 4:
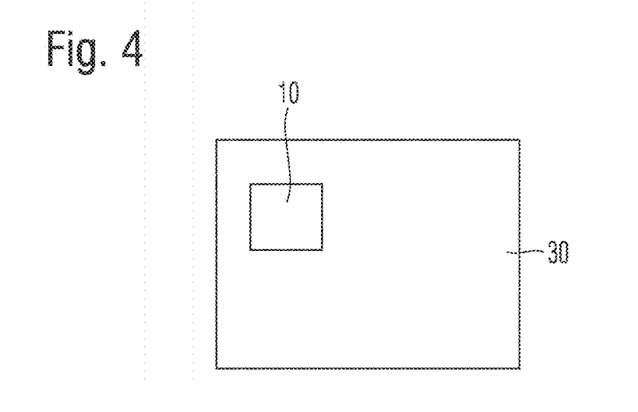
FIG. 4 illustrates an optoelectronic device according to embodiments.

FIG. 4 shows an optoelectronic device which includes the optoelectronic semiconductor component described above. For example, the optoelectronic device may be a UV illumination device that may be used, for example, for disinfection or for skin treatment or for curing polymers. For example, it may also be an analyzer for detecting gases such as ammonia or sulfur oxides.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

The invention claimed is:

1. An optoelectronic semiconductor component comprising:
    a first semiconductor layer of a first conductivity type;
    a second semiconductor layer of a second conductivity type,
    wherein a respective semiconductor material of the first and second semiconductor layers are each a compound semiconductor material including a first, a second and a third composition element;
    a second contact region configured to electrically contact the second semiconductor layer,
    wherein the first semiconductor layer is patterned and arranged over the second semiconductor layer,
    wherein the second contact region is arranged between patterned regions of the first semiconductor layer,
    wherein the second contact region comprises a second metallic contact layer and a semiconductor contact layer between the second metallic contact layer and the second semiconductor layer,
    wherein a semiconductor material of the semiconductor contact layer includes the first, second and third composition elements, and
    wherein a concentration of the first and second composition elements varies from a position on a side of the second semiconductor layer to a position on a side of the second metallic contact layer; and
    a semiconductor connecting layer arranged between the semiconductor contact layer and the second metallic contact layer, the semiconductor connecting layer including two composition elements selected from the group consisting of the first, second and third composition elements, wherein a band gap of a material of the semiconductor connecting layer is smaller than a band gap of the second semiconductor layer.

2. The optoelectronic semiconductor component according to claim 1, wherein the semiconductor connecting layer includes solely two composition element selected from the group consisting of the first, second and third composition elements.

3. The optoelectronic semiconductor component according to claim 1, wherein a concentration of a composition element of the semiconductor contact layer decreases in a region from the second semiconductor layer to the second metallic contact layer.

4. The optoelectronic semiconductor component according to claim 1, wherein the first semiconductor layer includes a plurality of sublayers composed of the same composition elements, and wherein a doping level or a composition ratio of the composition elements differ in at least two sublayers.

5. The optoelectronic semiconductor component according to claim 1, wherein each composition element of the second semiconductor layer is selected from the group consisting of In, Al, Ga, B and N.

6. A method for producing an optoelectronic semiconductor component, the method comprising:
    patterning a first semiconductor layer of a first conductivity type, which is arranged over a second semiconductor layer of a second conductivity type such that the first semiconductor layer is removed from parts of the second semiconductor layer and patterned regions of the first semiconductor layer are formed,
    wherein a semiconductor material of the first and second semiconductor layers is a respective compound semiconductor material including a first, a second and a third composition element;

forming a semiconductor contact layer and a second metallic contact layer between the patterned regions of the first semiconductor layer such that a second contact region is formed for electrically contacting the second semiconductor layer, wherein the semiconductor contact layer is formed between the second metallic contact layer and the second semiconductor layer, wherein a semiconductor material of the semiconductor contact layer includes the first, second and third composition elements, wherein a concentration of the first and second composition element varies from a position on a side of the second semiconductor layer to a position on a side of the second metallic contact layer, and wherein the semiconductor contact layer is formed by selective epitaxial growth over exposed regions of the second semiconductor layer, and forming a semiconductor connecting layer between the semiconductor contact layer and the second metallic contact layer, wherein the semiconductor connecting layer includes two composition elements selected from the group consisting of the first, second and third composition elements.

7. The method according to claim 6, wherein a concentration of a composition element of the semiconductor contact layer decreases in a region from the second semiconductor layer to the second metallic contact layer.

8. The method according to claim 6, further comprising forming a layer stack comprising the first and second semiconductor layers before patterning the first semiconductor layer.

9. An optoelectronic semiconductor component comprising:

a first semiconductor layer of a first conductivity type;

a second semiconductor layer of a second conductivity type;

a second contact region configured to electrically contact the second semiconductor layer, wherein the first semiconductor layer is patterned and arranged over the second semiconductor layer, wherein the second contact region is arranged between patterned regions of the first semiconductor layer, wherein the second contact region comprises a second metallic contact layer and a semiconductor contact layer between the second metallic contact layer and the second semiconductor layer, and wherein a band gap of a semiconductor material of the semiconductor contact layer decreases from a position on a side of the second semiconductor layer to a position on the side of the second metallic contact layer; and a semiconductor connecting layer arranged between the semiconductor contact layer and the second metallic contact layer, wherein the band gap of a material of the semiconductor connecting layer is smaller than a band gap of the second semiconductor layer, and wherein the band gap of the semiconductor material of the semiconductor contact layer is smaller than the band gap of the semiconductor material of the second semiconductor layer and larger than the band gap of the semiconductor material of the semiconductor connecting layer.

* * * * *